(12) United States Patent
Zhang et al.

(10) Patent No.: US 12,289,969 B2
(45) Date of Patent: Apr. 29, 2025

(54) WIRE ROUTING OF DISPLAY SUBSTRATE HAVING SENSING AREA, DISPLAY SUBSTRATE AND APPARATUS THEREOF

(71) Applicant: BOE TECHNOLOGY GROUP CO., LTD., Beijing (CN)

(72) Inventors: Hao Zhang, Beijing (CN); Libin Liu, Beijing (CN); Zhongji Jin, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 505 days.

(21) Appl. No.: 17/763,835

(22) PCT Filed: May 19, 2021

(86) PCT No.: PCT/CN2021/094494
§ 371 (c)(1),
(2) Date: Mar. 25, 2022

(87) PCT Pub. No.: WO2021/244285
PCT Pub. Date: Dec. 9, 2021

(65) Prior Publication Data
US 2022/0376025 A1    Nov. 24, 2022

(30) Foreign Application Priority Data

Jun. 2, 2020   (CN) .......................... 202010493017.0

(51) Int. Cl.
*H10K 59/131*    (2023.01)
*H10K 59/65*    (2023.01)

(52) U.S. Cl.
CPC ........... *H10K 59/131* (2023.02); *H10K 59/65* (2023.02)

(58) Field of Classification Search
CPC ...... H10K 59/131; H10K 59/12; H10K 59/65; H10K 39/34
See application file for complete search history.

(56) References Cited

U.S. PATENT DOCUMENTS

2017/0154566 A1   6/2017  Ryoo et al.
2019/0115415 A1*  4/2019  Choi .................... H10K 50/805
(Continued)

FOREIGN PATENT DOCUMENTS

CN    110288943 A    9/2019
CN    110707139 A    1/2020
(Continued)

OTHER PUBLICATIONS

China Patent Office, CN202010493017.0 First Office Action issued on Sep. 5, 2022.

*Primary Examiner* — Ratisha Mehta
*Assistant Examiner* — Brad A Knudson
(74) *Attorney, Agent, or Firm* — HOUTTEMAN LAW LLC

(57) ABSTRACT

A display substrate has a screen area, the screen area includes at least one sensing area and a display area surrounding each sensing area, the sensing area includes a light-transmitting area and a routing area. The display substrate includes: a plurality of first gate lines, each of which includes a gate line main body part in the display area and a gate line connecting part; and a plurality of first data lines, each of which includes a data line main body part in the display area and a data line connecting part. For any one of the routing areas, the plurality of data line connecting parts are respectively in at least two metal layers insulated and spaced from each other, and/or, the plurality of gate line connecting parts are respectively arranged in at least two metal layers insulated and spaced from each other.

14 Claims, 12 Drawing Sheets

(56) References Cited

U.S. PATENT DOCUMENTS

| | | | |
|---|---|---|---|
| 2020/0064702 A1* | 2/2020 | Yeh | H10K 59/122 |
| 2020/0098843 A1* | 3/2020 | Jeon | H10K 59/131 |
| 2020/0394381 A1* | 12/2020 | Ryu | G09G 3/3233 |
| 2021/0066433 A1* | 3/2021 | Cha | H10K 59/131 |
| 2021/0090490 A1* | 3/2021 | Lee | G06F 1/1637 |

FOREIGN PATENT DOCUMENTS

| | | | | |
|---|---|---|---|---|
| CN | 110780501 A | * | 2/2020 | G02F 1/1362 |
| CN | 110942752 A | | 3/2020 | |
| CN | 111613658 A | | 9/2020 | |

* cited by examiner

WIRE ROUTING OF DISPLAY SUBSTRATE HAVING SENSING AREA, DISPLAY SUBSTRATE AND APPARATUS THEREOF

TECHNICAL FIELD

The present disclosure relates to the field of display technology, and in particular, to a display substrate and a display apparatus.

BACKGROUND

At present, in order to realize a full-screen display of a display apparatus such as a mobile phone, a blind hole is arranged in a display screen to form a light-transmitting area, and a sensing device such as a camera or a face recognition device is arranged on the back side of the display screen and directly opposite to the blind hole. Since a light-shielding structure cannot be provided in the light-transmitting area, some signal lines need to be wound around the blind hole (i.e., around the light-transmitting area).

SUMMARY

The embodiments of present disclosure provide a display substrate and a display apparatus.

In a first aspect, an embodiment of the present disclosure provides a display substrate, having a screen area, the screen area including at least one sensing area and a display area surrounding each of the at least one sensing area, the sensing area including a light-transmitting area and a routing area surrounding the light-transmitting area, wherein the display substrate includes:

a plurality of first gate lines, each of the plurality of first gate lines including a gate line main body part in the display area and a gate line connecting part connected to the gate line main body part, and at least a portion of the gate line connecting part being in the routing area and being bent along an edge trend of the light-transmitting area; and a plurality of first data lines insulated and spaced from each of the plurality of first gate lines, each of the plurality of first data lines including a data line main body part in the display area and a data line connecting part connected to the data line main body part, at least a portion of the data line connecting part being in the routing area and being bent along the edge trend of the light-transmitting area, and for any one of the routing areas, the plurality of data line connecting parts in the routing area are respectively in at least two metal layers insulated and spaced from each other, and/or, the plurality of gate line connecting parts in the routing area are respectively in at least two metal layers insulated and spaced from each other.

In some embodiments, the display substrate further includes pixel structures in a plurality of rows and in a plurality of columns, which are in the display area, each of the at least one sensing area overlaps at least two rows of the pixel structures in a row direction and overlaps at least two columns of the pixel structures in a column direction, and each row of pixel structures overlapped with the sensing area in the row direction are connected to one of the plurality of first gate line, and each column of pixel structures overlapped with the sensing area in the column direction are connected to at least one of the plurality of first data line.

In some embodiments, the gate line main body part is in a first gate metal layer, and the data line main body part is in a source/drain metal layer, the at least one sensing area includes at least one first sensing area and/or at least one second sensing area, a plurality of gate line connecting parts and a plurality of data line connecting parts are in the routing area of each of the at least one first sensing area, and each of the plurality of gate line connecting part in the routing area of the first sensing area is in a source/drain metal layer; the plurality of data line connecting parts in the routing area of the first sensing area are respectively in the first gate metal layer and a second gate metal layer which is between the first gate metal layer and the source/drain metal layer, and a plurality of gate line connecting parts and a plurality of data line connecting parts are in the routing area of each of the at least one second sensing area, the plurality of gate line connecting parts in the routing area of the second sensing area are respectively in the first gate metal layer and the second gate metal layer, and the plurality of data line connecting parts in the routing area of the second sensing area are all in the source/drain metal layer.

In some embodiments, the light-transmitting area of the first sensing area is a circular area with a diameter of d1, the light-transmitting area of the second sensing area is a circular area with a diameter of d2, and d1 is greater than d2.

In some embodiments, the diameter of d1 is between 3 mm and 4 mm, and the diameter of d2 is between 0.5 mm and 1.5 mm.

In some embodiments, the display substrate further includes: a gate insulating layer between the first gate metal layer and the second gate metal layer, and an interlayer dielectric layer between the second gate metal layer and the source/drain metal layer, the gate line connecting part in the source/drain metal layer is connected to a corresponding gate line main body part through a first via, which penetrates through the interlayer dielectric layer and the gate insulating layer, the data line connecting part in the first gate metal layer is connected to a corresponding data line main body part through a second via, which penetrates through the interlayer dielectric layer and the gate insulating layer, the data line connecting part in the second gate metal layer is connected to a corresponding data line main body part through a third via, which penetrates through the interlayer dielectric layer, and the gate line connecting part in the first gate metal layer or the second gate metal layer is connected to a corresponding gate line main body part through a first transitional connector, which is in the source/drain metal layer.

In some embodiments, the display substrate further includes a plurality of first light-emitting control lines and a plurality of first initialization lines, each row of the pixel structures overlapped with the sensing area in the row direction are connected to one of the plurality of first light-emitting control lines and one of the plurality of first initialization lines, and the first light-emitting control line includes control line main body parts on both sides of the sensing area in the row direction, the control line main body parts are in the first gate metal layer; the first initialization line includes initialization line main body parts in the display area, each of the initialization line main body parts is in the second gate metal layer.

In some embodiments, the pixel structure includes a light-emitting element, and the at least one sensing area includes the at least one first sensing area, and the display substrate further includes a connecting line surrounding the first sensing area, each of the initialization line main body parts is connected to the connecting line, the connecting line is in the second gate metal layer or a first electrode layer, and the first electrode layer is a layer where a first electrode of the light-emitting element is located.

In some embodiments, the connecting line is a polyline including first extension parts extending along the row direction and second extension parts extending along the column direction, and the first extension parts and the second extension parts are alternately arranged and connected in sequence.

In some embodiments, the display substrate further includes: an interlayer dielectric layer between the second gate metal layer and the source/drain metal layer; and a planarization layer between the source/drain metal layer and the first electrode layer, and the connecting line is in the first electrode layer, the connecting line is connected to the initialization line main body part through a fourth via, which penetrates through the interlayer dielectric layer and the planarization layer.

In some embodiments, the at least one sensing area includes the at least one second sensing areas, the first light-emitting control line connected to each row of the pixel structures overlapping the second sensing area in the row direction further includes a control line connecting part in the routing area of the second sensing area, the control line connecting part is connected to control line main body parts on both sides of the second sensing area, the plurality of control line connecting parts in the routing area of the second sensing area are respectively in the first gate metal layer and the second gate metal layer, and the first initialization line connected to each row of the pixel structures overlapping the second sensing area in the row direction further includes an initialization line connecting part in the routing area of the second sensing area, the initialization line connecting part is connected to initialization line main body parts on both sides of the second sensing area, the plurality of initialization line connecting parts in the routing area of the second sensing area are respectively in the first gate metal layer and the second gate metal layer.

In some embodiments, the control line connecting part in the second gate metal layer is connected to a corresponding control line main body part through a second transitional connector, which is in the source/drain metal layer.

In some embodiments, the initialization line connecting part in the first gate metal layer is connected to a corresponding initialization line main body part through a third transitional connector, which is in the source/drain metal layer.

In some embodiments, wherein the display substrate further includes a plurality of second gate lines, a plurality of second data lines, a plurality of second initialization lines, and a plurality of second light-emitting control lines, each of the plurality of second gate lines, each of the plurality of second initialization lines, and each of the plurality of second light-emitting control lines, extend in the row direction, each of the plurality of second gate lines, each of the plurality of second initialization lines, and each of the plurality of second light-emitting control lines, do not overlap the sensing area in the row direction, each of the plurality of second data lines extends in the column direction, and each of the plurality of second data lines does not overlap the sensing area in the column direction, and the second gate line and the second light-emitting control line are in a first gate metal layer, the second initialization line is in a second gate metal layer, and the second data line is in a source/drain metal layer.

In some embodiments, the display substrate further includes a plurality of reset lines connected in a one-to-one correspondence to the plurality of rows of the pixel structures, the reset line connected to each row of the pixel structures overlapping the sensing area in the row direction includes reset line main body parts on both sides of the sensing area, each of the reset line main body parts is connected to the first gate line or the second gate line connected to a previous row of the pixel structures, and the reset line is in the first gate metal layer.

In some embodiments, the display substrate further includes a power supply line structure in a grid shape, each of the pixel structures is connected to the power supply line structure, the power supply line structure is outside the sensing area, the power supply line structure includes: a first power supply line extending in the row direction, which is in the second gate metal layer; and a second power supply line extending in the column direction, which is in the source/drain metal layer and connected to the first power supply line at an intersection with the first power supply line.

In a second aspect, an embodiment of the present disclosure provides a display apparatus, including: the display substrate provided by the above embodiments; and a sensing device on a backlight side of the display substrate, wherein the sensing device is directly opposite to the light-transmitting area.

BRIEF DESCRIPTION OF DRAWINGS

The accompanying drawings, which are included to provide a further understanding of the present disclosure and constitute a part of this specification, serve to explain the present disclosure together with the following detailed description, but do not constitute a limitation of the present disclosure. In the drawings.

DETAIL DESCRIPTION OF EMBODIMENTS

The embodiments of the present disclosure will be described in detail below with reference to the accompanying drawings. It should be understood that the embodiments described herein are only intended to illustrate and explain the present disclosure, but not to limit the present disclosure.

In order to make the objects, technical solutions and advantages of the embodiments of the present disclosure more apparent, the technical solutions of the embodiments of the present disclosure will be clearly and completely described below with reference to the drawings of the embodiments of the present disclosure. Obviously, the described embodiments are some, but not all, embodiments of the present disclosure. All other embodiments, which can be derived by one of ordinary skill in the art from the described embodiments of the present disclosure without creative efforts, are within the protection scope of the present disclosure.

The term used herein to describe embodiments of the present disclosure is not intended to limit and/or define the scope of the present disclosure. For example, unless otherwise defined, a technical or scientific term used herein shall have the ordinary meaning as understood by one of ordinary skill in the art to which the present disclosure belongs. It should be understood that the terms "first", "second", and the like, as used in the present disclosure, do not denote any order, quantity, or importance, but rather are used to distinguish one element from another. The singular form "a", "an", or "the" and the like does not denote a limitation of quantity, but rather denotes the presence of at least one, unless the context clearly dictates otherwise. The word "comprising" or "comprises", and the like, means that the element or item appearing in front of the word "comprising" or "comprises" includes the element or item listed after the word "comprising" or "comprises" and its equivalents, and does not exclude other elements or items. The term "connected" or "coupled" and the like is not restricted to a physical or mechanical connection, but may include an electrical connection, whether direct or indirect. The terms "upper", "lower", "left", "right", and the like are used merely to indicate relative positional relationships, which may also change accordingly when the absolute position of the object being described changes.

In the following description, when an element or layer is referred to as being "on" or "connected to" another element or layer, it may be directly on, connected to, or intervening elements or layers may be present. However, when an element or layer is referred to as being "directly on" or "directly connected to" another element or layer, there are no intervening elements or layers present. The term "and/or" includes any and all combinations of one or more of the associated listed items.

Figure 1A:
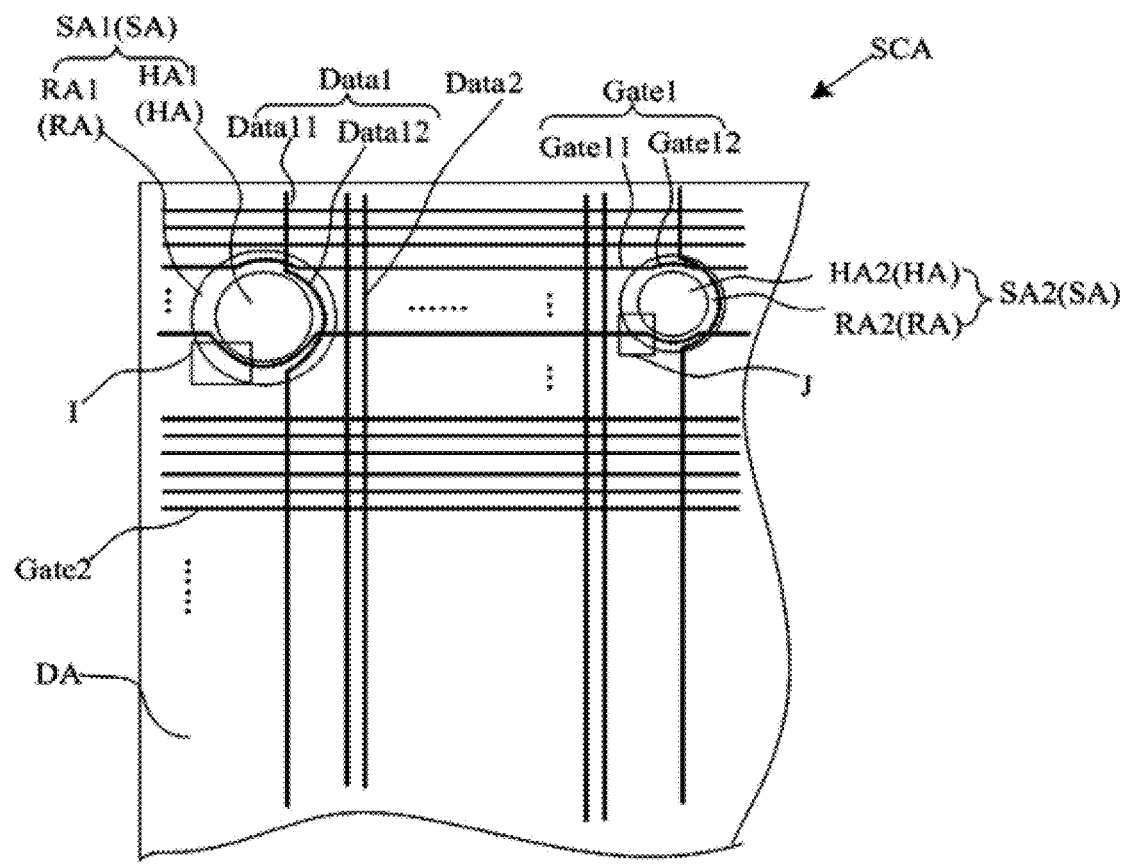
FIG. 1A is a partial schematic diagram of a screen area of a display substrate provided in some embodiments of the present disclosure.

An embodiment of the present disclosure provides a display substrate having a screen area. FIG. 1A is a partial schematic diagram of the screen area of the display substrate provided in some embodiments of the present disclosure. As shown in FIG. 1A, the screen area SCA includes at least one sensing area SA and a display area DA surrounding each sensing area SA, and the sensing area SA includes a light-transmitting area HA and a routing area RA surrounding the light-transmitting area HA. Alternatively, the light-transmitting area HA is a circular or approximately circular area.

The display substrate includes: a plurality of first gate lines Gate1 and a plurality of first data lines Data1. Each of the plurality of first gate lines Gate1 includes a gate line main body part Gate11 located in the display area and a gate line connecting part Gate12 connected to the gate line main body part Gate11, and at least a portion of the gate line connecting part Gate12 is located in the routing area RA and is bent along an edge trend of the light-transmitting area HA. The plurality of first data lines Data1 are spaced apart from each first gate line Gate1, and each of the plurality of first data lines Data1 includes a data line main body part Data11 located in the display area DA and a data line connecting part Data12 connected to the data line main body part Data11, and at least a portion of the data line connecting part Data12 is located in the routing area RA and is bent along the edge trend of the light-transmitting area HA.

In the present disclosure, at least a portion of the gate line connecting part Gate12 (or the data line connecting part Data12) is located in the routing area RA and is bent along the edge trend of the light-transmitting area HA, which means that a shape of the at least a portion of the gate line connecting part Gate12 (or the data line connecting part Data12) is substantially the same as a shape of an edge of the light-transmitting area HA. For example, if the edge of the light-transmitting area HA is circular, the at least a portion of the gate line connecting part Gate12 (or the data line connecting part Data12) is arc-shaped with a curvature close to that of the edge of the light-transmitting area HA.

Only a small number of first gate lines Gate1 and first data lines Data1 are schematically shown in FIG. 1A, but it should be understood that in an actual product, the number of the first gate lines Gate1 and the number of the first data lines Data1 are each large, and each routing area RA is provided with the gate line connecting parts Gate12 of the plurality of first gate lines Gate1 and the data line connecting parts Data12 of the plurality of first data lines Data1. For any one routing area HA, the data line connecting parts Data12 in the routing area HA are respectively disposed in at least two metal layers insulated and spaced from each other, and/or, the gate line connecting parts Gate12 in the routing area HA are respectively disposed in at least two metal layers insulated and spaced from each other.

It should be noted that, where there are a plurality of sensing areas SA, in the routing areas RA of different sensing areas SA, the data line connecting parts Data12 may be arranged in different manners, and the gate line connecting parts Gate12 may also be arranged in different manners. For example, in the routing area RA of one of the sensing areas SA, the data line connecting parts Data12 are respectively disposed in two metal layers insulated and spaced from each other, and the gate line connecting parts Gate12 are disposed in a same metal layer; in the routing area RA of another sensing area SA, the data line connecting parts Data12 are disposed in a same metal layer, and the gate line connecting parts Gate12 are respectively disposed in two metal layers insulated and spaced from each other.

The display substrate further includes pixel structures in a plurality of rows and a plurality of columns, which are located in the display area DA and are not located in the sensing area SA. It will be understood that, since the rows and columns of pixel structures avoid the sensing area SA, the number of pixel structures in each row is not necessarily the same, nor is the number of pixel structures in each column. No other structure is arranged in the light-transmitting area of the sensing area, so that a blind hole located in the light-transmitting area HA is formed in the display substrate. In the pixel structures of multiple rows and multiple columns in the display area DA, each row of pixel structures is connected to one gate line, each column of data line is connected to one data line. The gate lines transmit row scanning signals provided by the gate driving circuit to the pixel structures. The data lines transmit data signals provided by the source driving circuit to the pixel structures.

Alternatively, each sensing area SA overlaps at least two rows of pixel structures in a row direction, and overlaps at least two columns of pixel structures in a column direction. Each row of pixel structures overlapped with the sensing area SA in the row direction is connected to one first gate line Gate1, and each column of pixel structures overlapped with the sensing area SA in the column direction is connected to one first data line Data1. In an embodiment of the present disclosure, the first gate line Gate1 is a gate line connected to the pixel structures overlapping with the at least one sensing area SA in the row direction; the first data line Data1 is a data line connected to the pixel structures overlapping with the at least one sensing area SA in the column direction.

It should be understood that the pixel structures overlapping with the at least one sensing area SA in the row direction refers to the pixel structures located on both sides of the at least one sensing area SA in the row direction. For example, the row direction is a left-right direction in FIG. 1A, and the pixel structures overlapping with the at least one sensing area SA in the row direction is the pixel structures on both the left side and the right side of each sensing area SA. Similarly, the pixel structures overlapping with the at least one sensing area SA in the column direction refer to the pixel structures located on both sides of the at least one sensing area SA in the column direction. For example, the column direction is an up-down direction in FIG. 1A, and the pixel structures overlapping with the at least one sensing area SA in the column direction are the pixel structures located on the upper side and the lower side of each sensing area.

In an embodiment of the present disclosure, the data line connecting parts Data12 in the routing area RA are disposed in at least two metal layers insulated and spaced from each other, and/or the gate line connecting parts Gate12 in the routing area RA are disposed in at least two metal layers insulated and spaced from each other, so that under the condition that the number of the first gate lines Gate1 and the number of the first data lines Data1 are both fixed, the overall area occupied by the wires in the routing area RA can be reduced, thereby reducing the width of the routing area RA, and further making the frame around the sensing device such as a camera narrower.

In an embodiment of the present disclosure, the display substrate further includes a plurality of second gate lines Gate2 and a plurality of second data lines Data2. Each of the plurality of second gate lines Gate2 extends in the row direction, and each second gate line Gate2 does not overlap any of the sensing areas SA in the row direction. Each of the plurality of second data lines Data2 extends in the column direction, and each second data line Data2 does not overlap the sensing area SA in the column direction. For example, m rows and n columns of pixel structures are disposed in the display area DA, wherein m1 rows of pixel structures overlap the at least one sensing area SA in the row direction, n1 columns of pixel structures overlap the at least one sensing area SA in the column direction, m2 rows of pixel structures do not overlap the at least one sensing area SA in the row direction, and n2 rows of pixel structures do not overlap the at least one sensing area SA in the column direction.

Alternatively, the plurality of second gate lines Gate2 are disposed in a same metal layer, and the plurality of second data lines Data2 are disposed in a same metal layer.

Figure 1B:
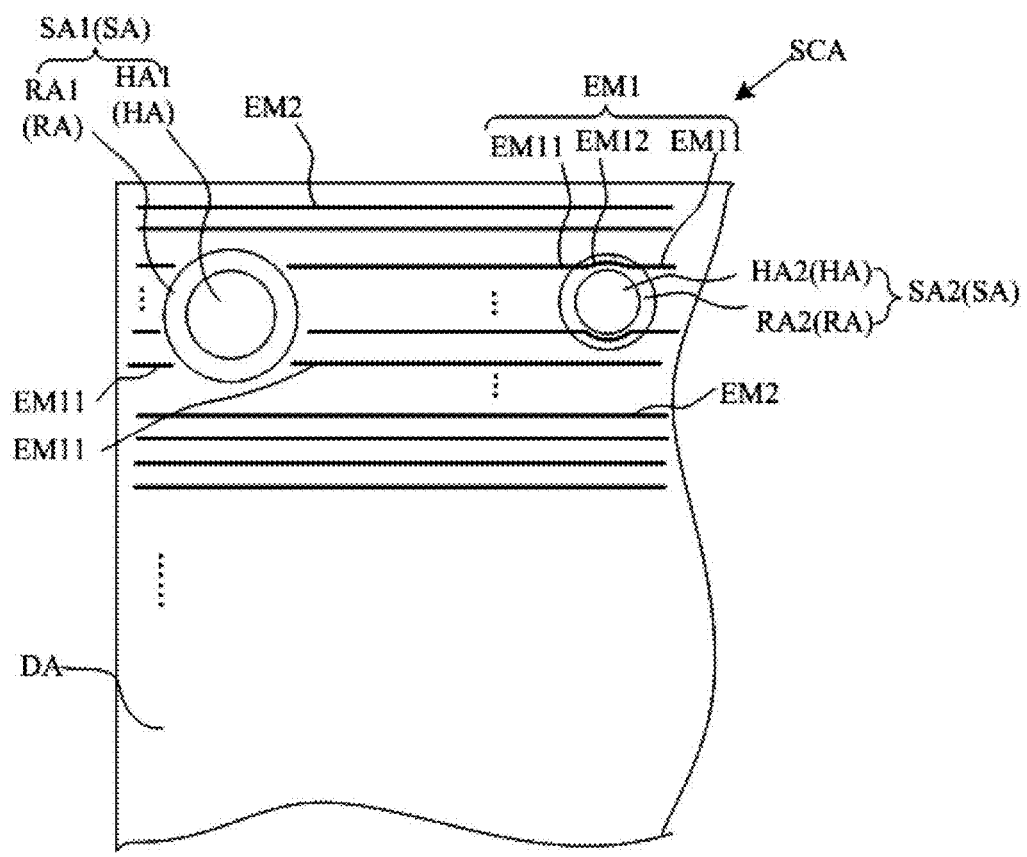
FIG. 1B is another partial schematic diagram of a screen area of a display substrate provided in some embodiments of the present disclosure.
Figure 1C:
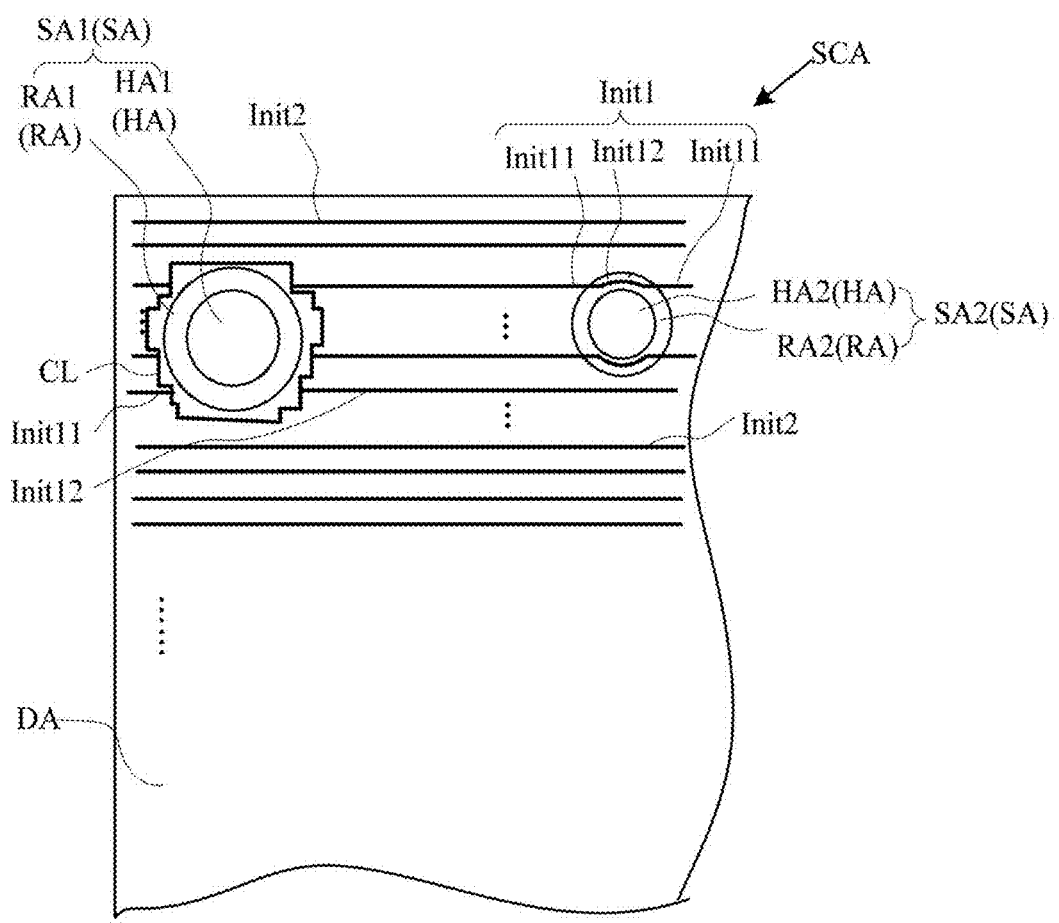
FIG. 1C is another partial schematic diagram of a screen area of a display substrate provided in some embodiments of the present disclosure.

FIG. 1B is another partial schematic diagram of a screen area of a display substrate provided in some embodiments of the present disclosure, and FIG. 1B illustrates light-emitting control lines in the screen area. FIG. 1C is another partial schematic diagram of a screen area of a display substrate provided in some embodiments of the present disclosure, and FIG. 1C illustrates initialization lines in the screen area. As shown in FIGS. 1B and 1C, in an embodiment of the present disclosure, the display substrate further includes: a plurality of light-emitting control lines (i.e., first and second light-emitting control lines EM1 and EM2) corresponding one-to-one with a plurality of rows of pixel structures, a plurality of initialization lines (i.e., first and second initialization lines Init1 and Init2) corresponding one-to-one with a plurality of rows of pixel structures, and reset lines corresponding one-to-one with a plurality of rows of pixel structures. The reset line is used for providing a reset signal to the pixel structure, the initialization line is used for providing an initialization signal to the pixel structure, and the light-emitting control line is used for providing a light-emitting control signal to the pixel structure.

The plurality of light-emitting control lines include a plurality of first light-emitting control lines EM1 and a plurality of second light-emitting control lines EM2, and the plurality of initialization lines include a plurality of first initialization lines Init1 and a plurality of second initialization lines Init2. Each row of pixel structures overlapping with the sensing area SA in the row direction is connected to one first light-emitting control line EM1 and one first initialization line Init1, and each row of pixel structures not overlapping with the sensing area SA in the row direction is connected to one second light-emitting control line EM2 and one second initialization line Init2. That is, the light-emitting control line connected to the pixel structures overlapping with the sensing areas SA in the row direction is the first light-emitting control line EM1, the light-emitting control line connected to the pixel structures not overlapping with any of the sensing areas SA in the row direction is the second light-emitting control line EM2, the initialization line connected to the pixel structures overlapping with the sensing areas SA in the column direction is the first initialization line Init1, and the initialization line connected to the pixel structures not overlapping with any of the sensing areas SA in the column direction is the second initialization line Init2. Each of the second initialization lines Init2 and the second light-emitting control lines EM2 extends in the row direction. Each of the second initialization lines Init2 and the second light-emitting control lines EM2 does not overlap with the sensing area in the row direction.

Alternatively, the second light-emitting control line EM2 is disposed in a same metal layer as the gate line main body part Gate11, and the plurality of second initialization lines Init2 are disposed in a same metal layer.

Alternatively, the first light-emitting control line EM1 includes control line main body parts EM11 located on both sides of the sensing area SA in the row direction, the control line main body parts EM11 and the gate line main body parts Gate11 are disposed in a same metal layer. The first initialization line Init1 includes initialization line main body parts Init11 located in the display area DA, the initialization line main body parts Init11 and the second initialization lines Init2 are disposed in a same metal layer.

It should be noted that each signal line in an embodiment of the present disclosure may be a whole signal line, or two or more segmented parts. The two or more segmented parts are spaced apart by a sensing area.

Figure 1D:
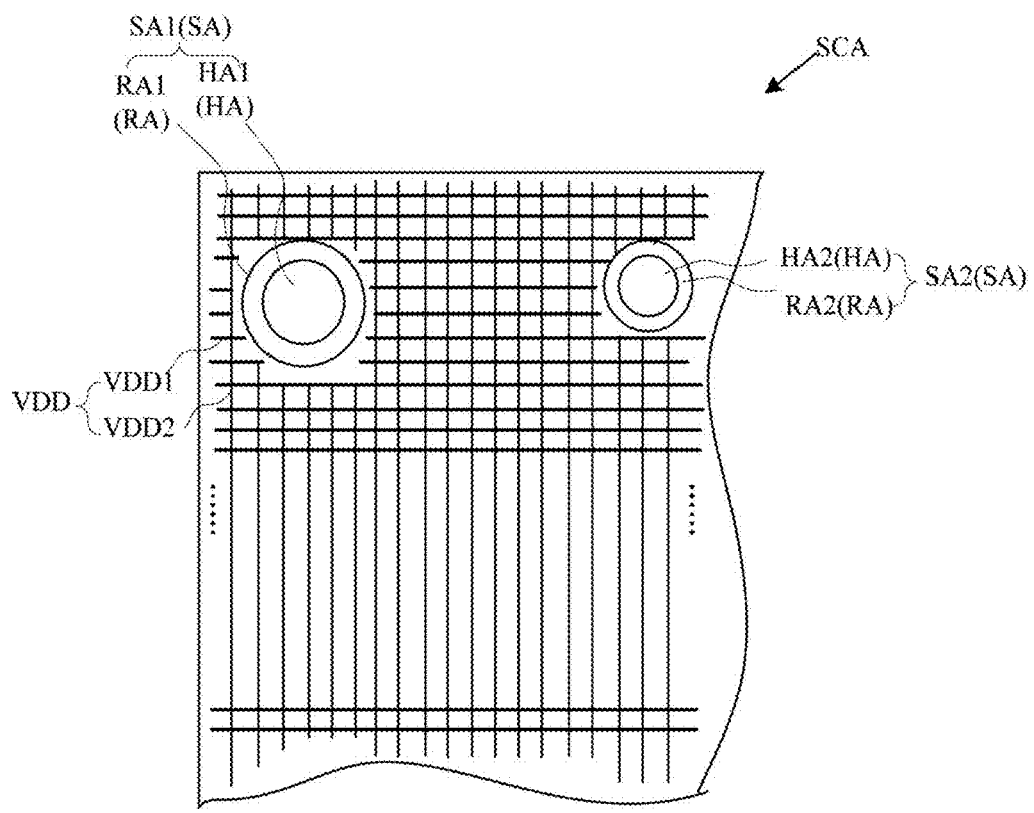
FIG. 1D is another partial schematic diagram of a screen area of a display substrate provided in some embodiments of the present disclosure.

FIG. 1D is another partial schematic diagram of a screen area of a display substrate provided in some embodiments of the present disclosure, and FIG. 1D illustrates a schematic diagram of a power supply line structure of the screen area. As shown in FIG. 1D, in some embodiments, the display substrate further includes a power supply line structure VDD in a grid shape, which is arranged outside the sensing area SA. The power supply line structure VDD includes first power supply lines VDD1 extending in the row direction and second power supply lines VDD2 extending in a column direction. The first power supply lines VDD1 and the second power supply lines VDD2 are arranged in different metal layers, and the first power supply lines VDD1 and the second power supply lines VDD2 are connected to each other at intersections. Each pixel structure is connected to the power supply line structure VDD. The power supply line structure VDD is used to provide a high level signal to the pixel structure.

Figure 2:
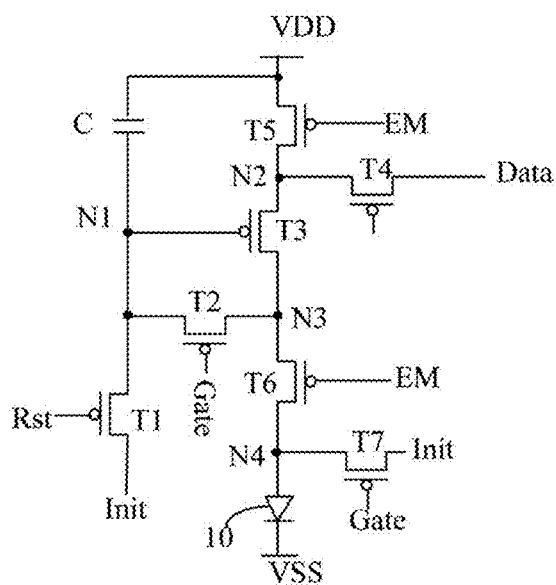
FIG. 2 is a schematic circuit diagram of a pixel structure provided in some embodiments of the present disclosure.
Figure 3:
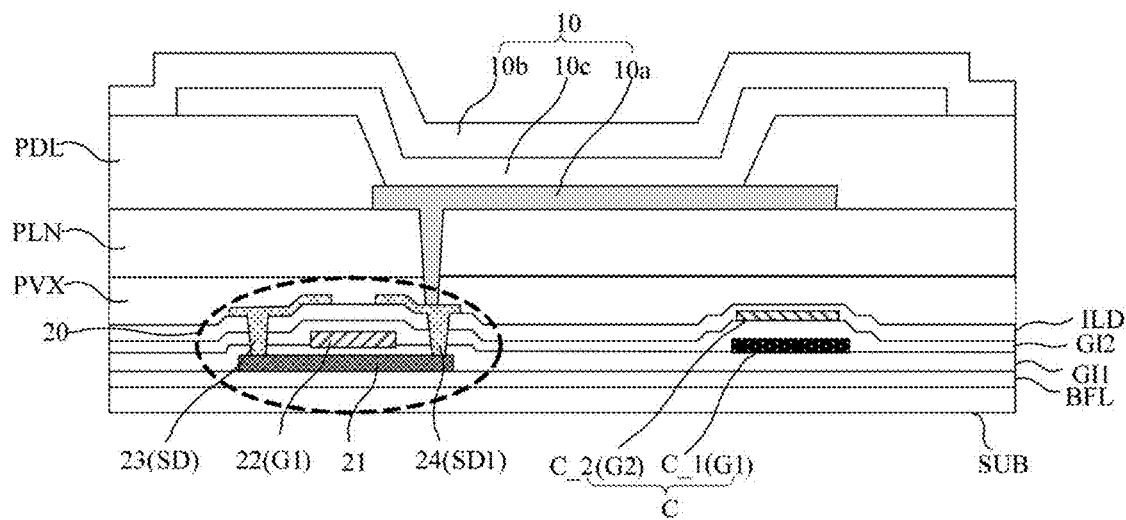
FIG. 3 is a schematic diagram of a partial structure of a pixel structure provided in some embodiments of the present disclosure.

FIG. 2 is a schematic circuit diagram of a pixel structure provided in some embodiments of the present disclosure, and FIG. 3 is a schematic diagram of a partial structure of the pixel structure provided in some embodiments of the present disclosure. As shown in FIGS. 2 and 3, the pixel structure includes a pixel driving circuit and a light-emitting element 10, wherein the light-emitting element 10 may be an Organic Light-Emitting Diode (OLED), and the OLED may emit, for example, a red light, a green light, a blue light, or a white light. The pixel driving circuit may include a capacitor C and a plurality of transistors T1 to T7. As shown in FIG. 3, a first end of the capacitor C is connected to the power supply line structure VDD, and a second end of the capacitor C, a gate of the transistor T3, a first electrode of the transistor T1 and a first electrode of the transistor T2 are connected to a node N1. A gate of the transistor T1 is connected to a reset line Rst, and a second electrode of the transistor T1 is connected to an initialization line Init. A gate of the transistor T2 is connected to a gate line Gate, and a second electrode of the transistor T2, a first electrode of the transistor T6, and a second electrode of the transistor T3 are connected to a node N3. A gate of the transistor T4 is connected to the gate line Gate, a first electrode of the transistor T4, a second electrode of the transistor T5, and a first electrode of the transistor T3 are connected to a node N2, and a second electrode of the transistor T4 is connected to the data line Data. A gate of the transistor T5 and a gate of the transistor T6 are both connected to a light-emitting control line EM, a first electrode of the transistor T5 is connected to the power supply line structure VDD, a second electrode of the transistor T6, a first electrode of the light-emitting element, and a first electrode of the transistor T7 are connected to a node N4, a gate of the transistor T7 is connected to the gate line Gate, and a second electrode of the transistor T7 is connected to the initialization line Init. Alternatively, the first electrode of the light-emitting element 10 is an anode, the second electrode of the light-emitting element 10 is a cathode, and the cathode is connected to a low level signal line VSS.

Only one transistor, one capacitor, and the light-emitting element in the pixel structure are illustrated in FIG. 3. As shown in FIG. 3, a buffer layer BFL is disposed on the substrate SUB, and a transistor 20 is disposed on the buffer layer BFL. The transistor 20 includes an active layer 21, a gate 22, a source 23, and a drain 24, and the capacitor C includes a first plate C_1 and a second plate C_2. The light-emitting element 10 includes a first electrode 10a, a second electrode 10b, and a light-emitting layer 10c between the first electrode 10a and the second electrode 10b. The active layer 21 of each transistor in the pixel driving circuit is disposed in a semiconductor layer, and the material of the semiconductor layer may include, for example, an inorganic semiconductor material (e.g., polysilicon, amorphous silicon, etc.), an organic semiconductor material, or an oxide semiconductor material.

A first gate insulating layer GI1 is disposed on the semiconductor layer, and a material of the first gate insulating layer GI1 may include a silicon compound or a metal oxide. For example, the material of the first gate insulating layer GI1 includes silicon oxynitride (SiON), silicon oxide (SiOx), silicon nitride (SiNx), silicon oxycarbide (SiOxCy), silicon carbonitride (SiCxNy), aluminum oxide (AlOx), aluminum nitride (AlNx), tantalum oxide (TaOx), hafnium oxide (HfOx), zirconium oxide (ZrOx), titanium oxide (TiOx), or the like. In addition, the first gate insulating layer GI1 may be a single layer or multiple layers.

A gate of each transistor and the first plate C_1 of the capacitor C are disposed in a first gate metal layer. The first gate metal layer G1 is disposed on the first gate insulating layer GIL and a material of the first gate metal layer G1 may include, for example, a metal alloy, a metal nitride, a conductive metal oxide, a transparent conductive material, or the like. For example, the first gate metal layer G1 may include gold (Au), an alloy of gold, silver (Ag), an alloy of silver, aluminum (Al), an alloy of aluminum, aluminum nitride (AlNx), tungsten (W), tungsten nitride (WNx), copper (Cu), an alloy of copper, nickel (Ni), chromium (Cr), chromium nitride (CrNx), molybdenum (Mo), an alloy of molybdenum, titanium (Ti), titanium nitride (TiNx), platinum (Pt), tantalum (Ta), tantalum nitride (TaNx), neodymium (Nd), scandium (Sc), Strontium Ruthenium Oxide (SRO), zinc oxide (ZnOx), tin oxide (SnOx), indium oxide (InOx), gallium oxide (GaOx), Indium Tin Oxide (ITO), zinc oxide (IZO), or the like. The first gate metal layer G1 may have a single layer or multiple layers.

A second gate insulating layer GI2 is disposed on the first gate electrode layer G1, and a material of the second gate insulating layer GI2 may include, for example, a silicon compound, or a metal oxide. In particular, the silicon compounds and metal oxides listed above may be selected and will not be described in detail herein. The second gate insulating layer GI2 may be formed as a single layer or multiple layers.

The second plate C_2 of the capacitor C is disposed in the second gate metal layer G2, and the second gate metal layer G2 is disposed on the second gate insulating layer GI2. A material of the second gate metal layer G2 may include a metal, a metal alloy, a metal nitride, a conductive metal oxide, or transparent conductive materials listed above, which are not described in detail herein.

An interlayer insulating layer ILD is disposed on the second gate metal layer G2, a material of the interlayer insulating layer ILD may include the silicon compounds or metal oxides listed above, and will not be described in detail herein.

A source/drain metal layer SD is disposed on the interlayer insulating layer ILD. The source and the drain of each transistor are arranged in the source/drain metal layer SD.

A passivation layer PVX is disposed on the source/drain conductive layer SD, and a material of the passivation layer PVX may include a silicon compound, for example, a silicon oxide, a silicon nitride, or a silicon oxynitride. A planarization layer PLN is disposed on the passivation layer PVX, and is made of an organic insulating material, for example, a resin material such as polyimide, epoxy resin, acryl, polyester, photoresist, polyacrylate, polyamide, siloxane, or the like. As another example, the organic insulating material includes an elastic material, such as urethane, Thermoplastic Polyurethane (TPU), or the like.

A pixel defining layer PDL is disposed on the planarization layer PLN. The pixel defining layer PDL includes pixel openings corresponding one-to-one with the light-emitting elements. A material of the pixel defining layer PDL may include an organic insulating material such as polyimide, polyphthalamide, acrylic resin, benzocyclobutene, or phenol resin.

A first electrode layer is disposed between the planarization layer PLN and the pixel defining layer PDL, and includes the first electrode 10a of each light-emitting element 10. The first electrode 10a is connected to the drain 24 of the transistor through a via penetrating through the planarization layer PLN and the passivation layer PVX. The first electrode 10a may be made of a material such as a metal, a metal alloy, a metal nitride, a conductive metal oxide, a transparent conductive material, or the like. A portion of the first electrode 10a is exposed through the pixel opening.

The light-emitting layer 10c is located in the corresponding pixel opening, and the light-emitting layer 10c may include a small molecule organic material or a polymer molecule organic material, which may be a fluorescent light-emitting material or a phosphorescent light-emitting material, and may emit a red light, a green light, a blue light, or a white light.

The second electrodes 10b of different light-emitting elements may be connected as one piece to form a second electrode layer. The second electrode 10b may be made of a metal, a metal alloy, a metal nitride, a conductive metal oxide, a transparent conductive material, or the like. Where a top emission type structure is employed, the first electrode 10a includes a conductive material having a light reflection property or includes a light reflection film, and the second electrode 10b includes a transparent or translucent conductive material. Where a bottom emission type structure is employed, the second electrode 10b includes a conductive material having a light reflection property or includes a light reflection film, and the first electrode 10a includes a transparent or translucent conductive material.

Figure 4A:
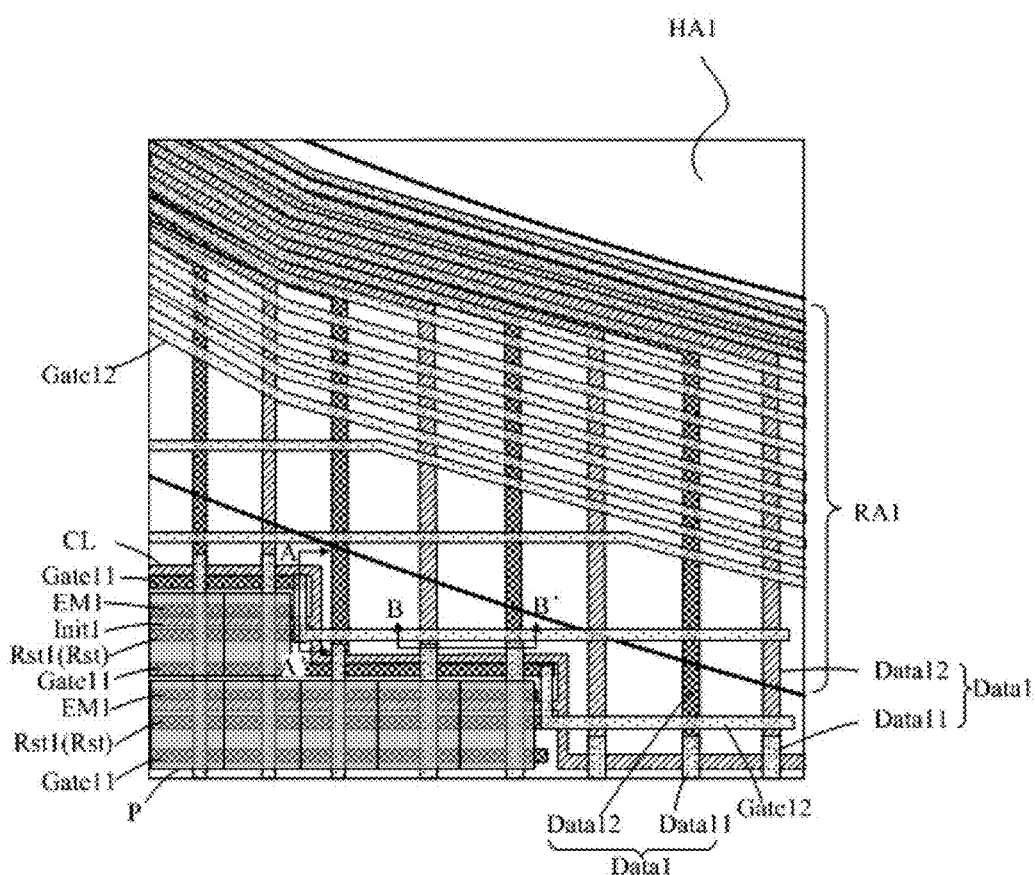
FIG. 4A is a schematic diagram of a specific structure of the area I in FIG. 1A.
Figure 4B:
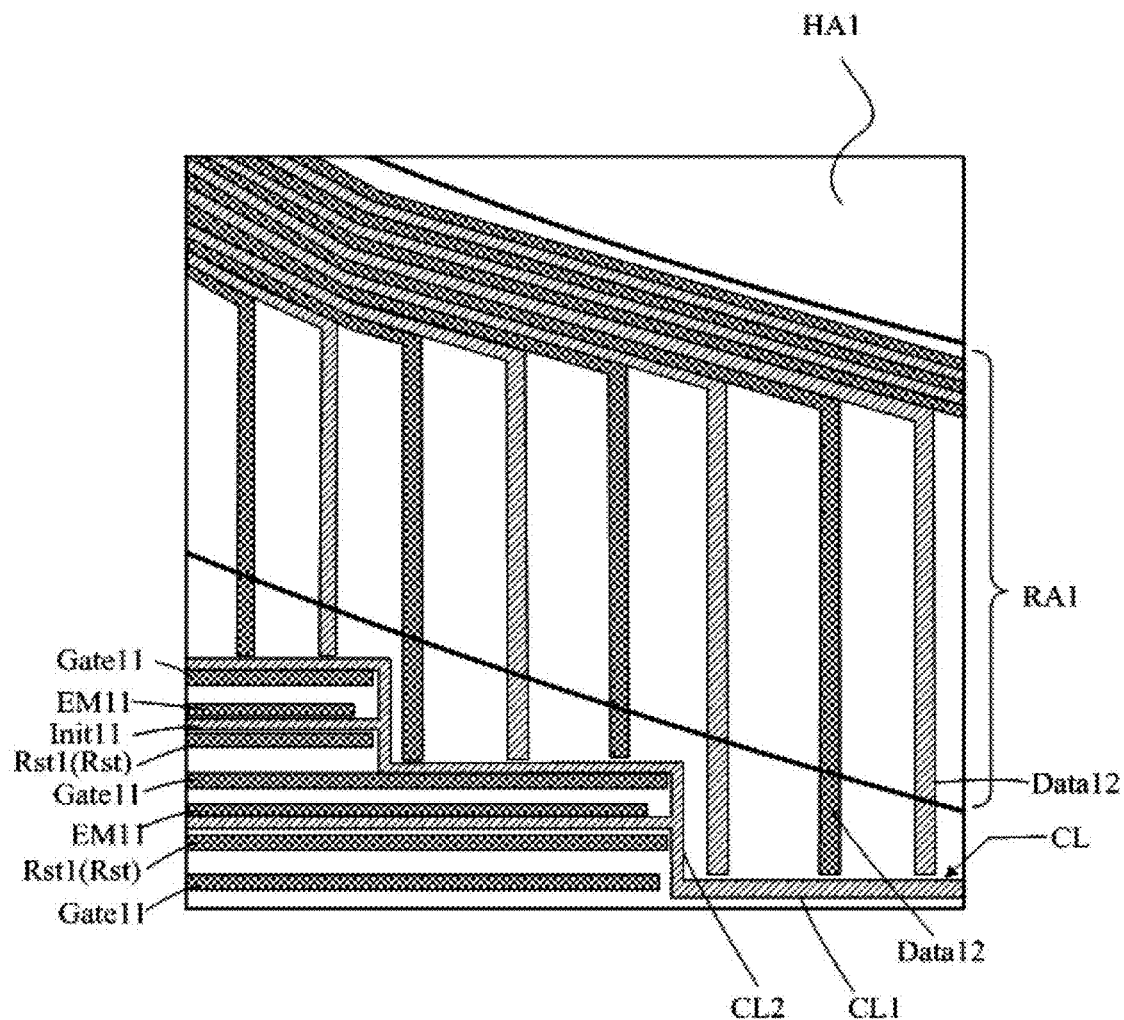
FIG. 4B is a schematic diagram of wiring in a first gate metal layer and a second gate metal layer in FIG. 4A.
Figure 4C:
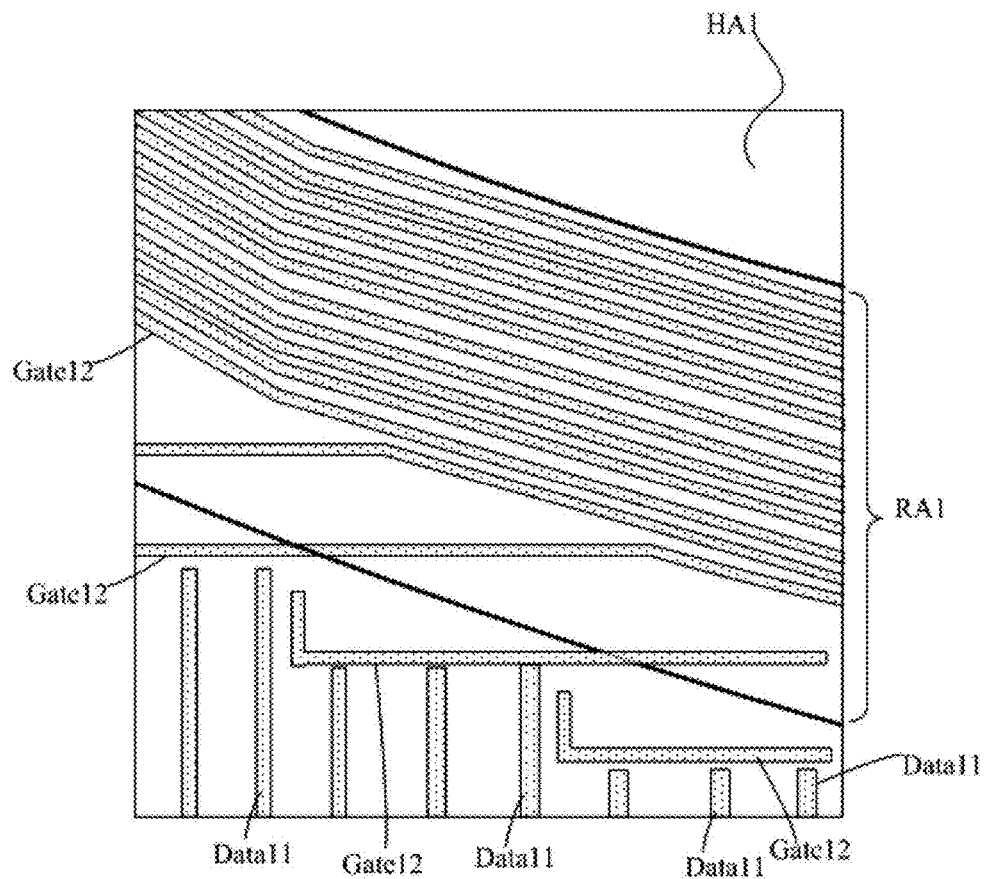
FIG. 4C is a schematic diagram of wiring in a source/drain metal layer in FIG. 4A.
Figure 4D:
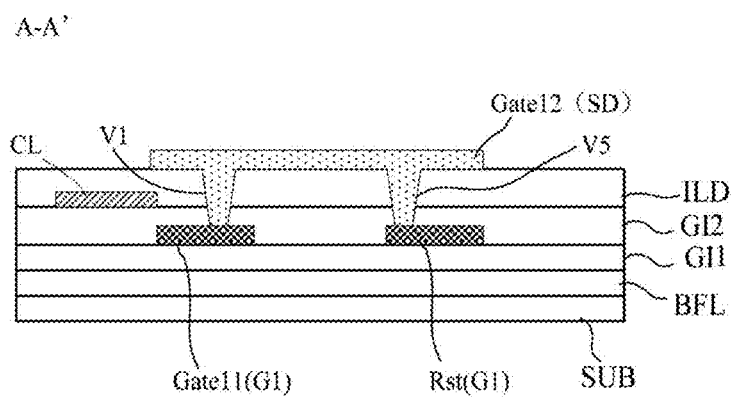
FIG. 4D is a cross-sectional view taken along the line AA' in FIG. 4A.
Figure 4E:
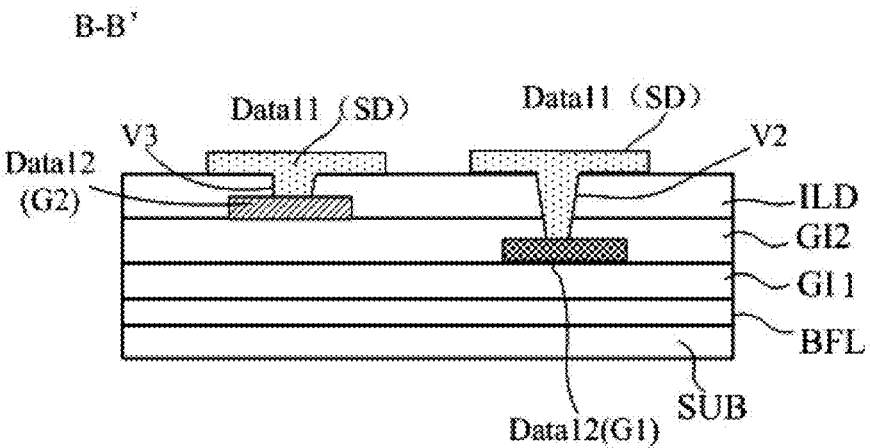
FIG. 4E is a cross-sectional view taken along the line BB' in FIG. 4A.
Figure 5A:
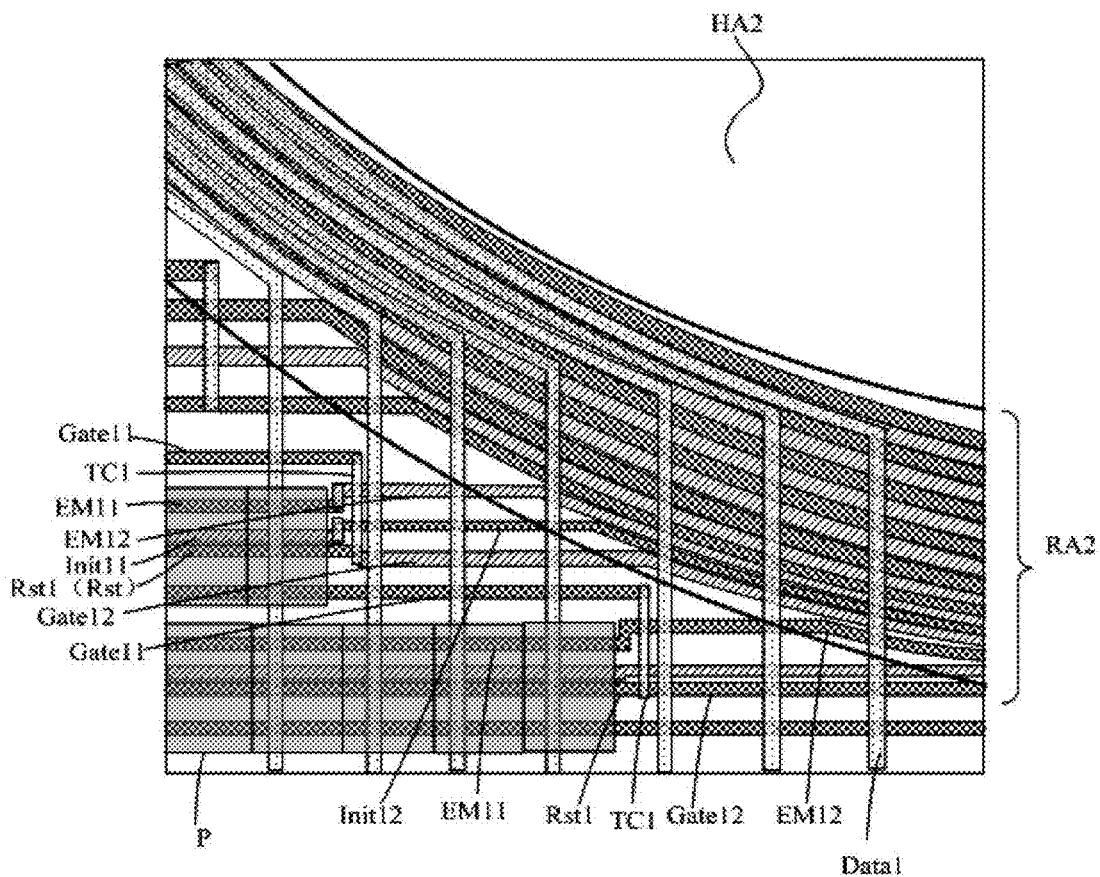
FIG. 5A is a schematic diagram of a specific structure of the area J in FIG. 1A.
Figure 5B:
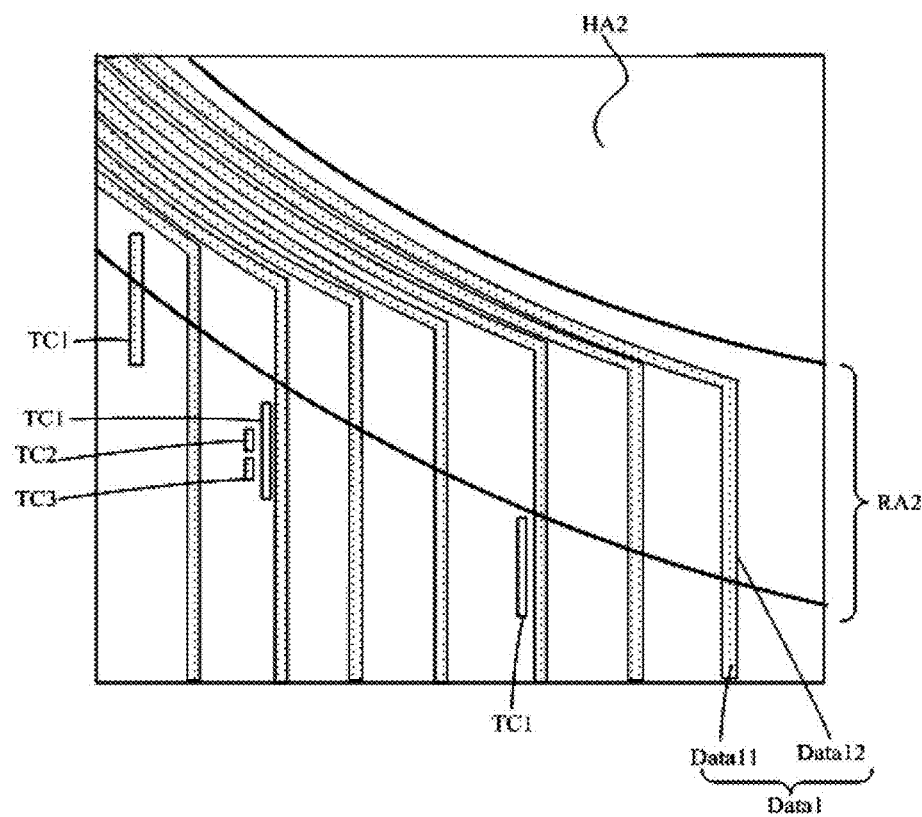
FIG. 5B is a schematic diagram of wiring in a first gate metal layer and a second gate metal layer in FIG. 5A.
Figure 5C:
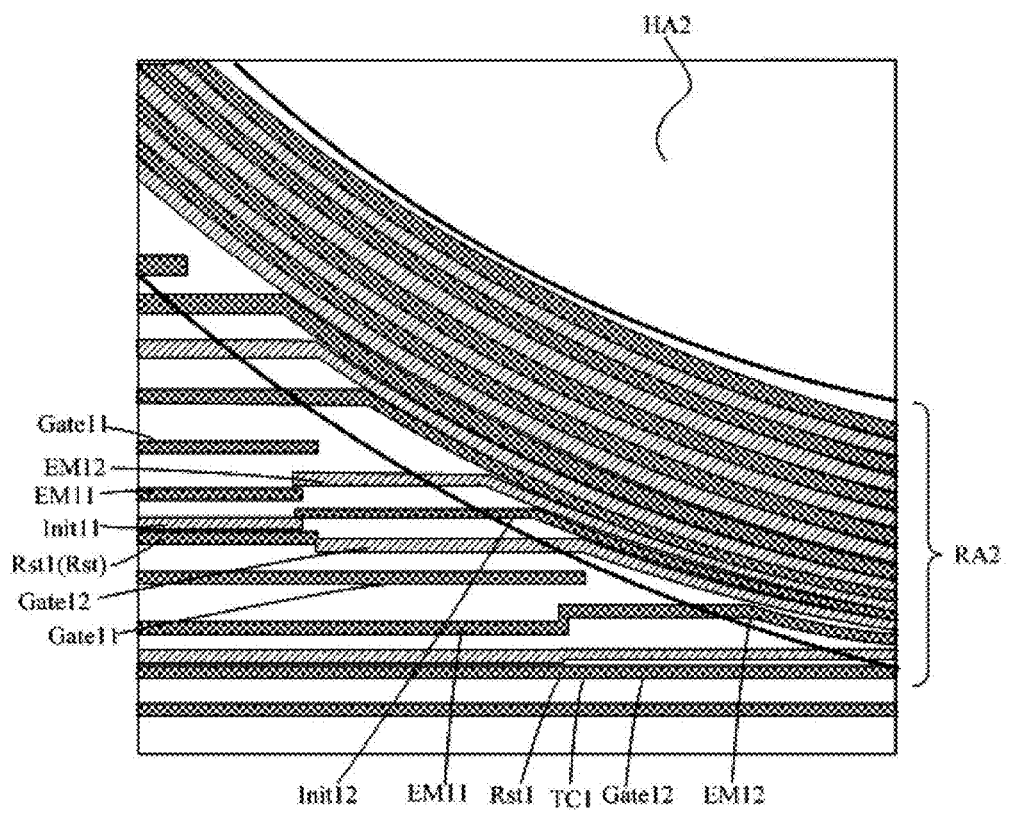
FIG. 5C is a schematic diagram of wiring in a source/drain metal layer in FIG. 5A.
Figure 5D:
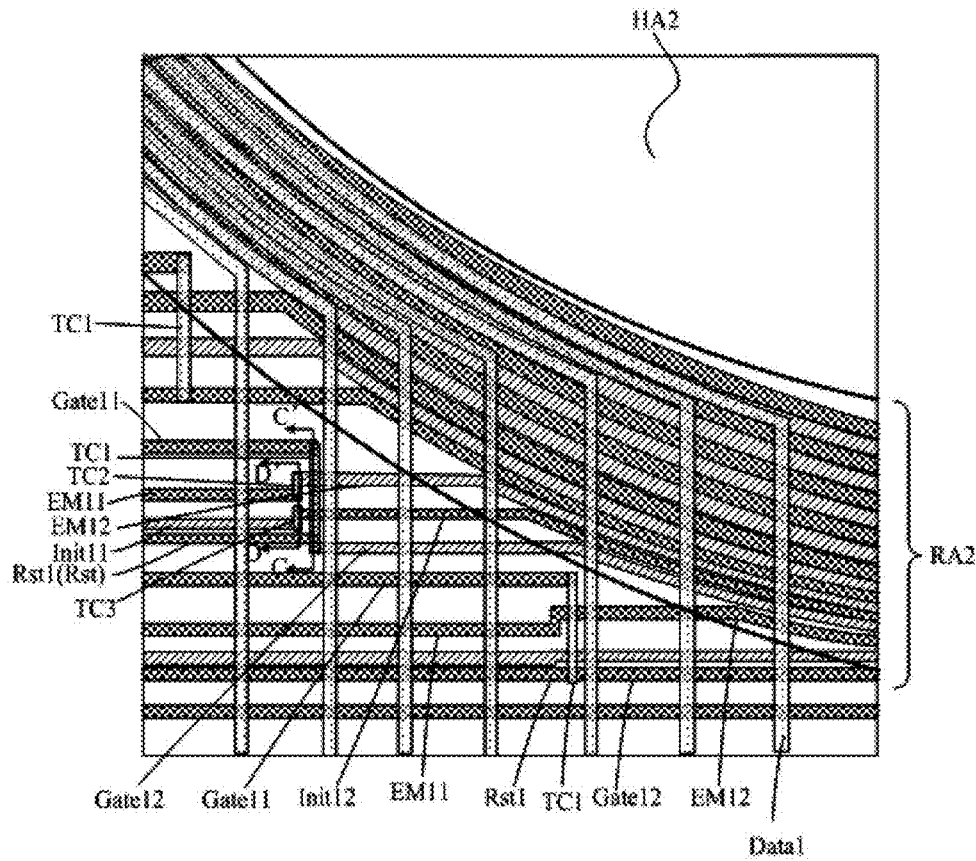
FIG. 5D is a schematic diagram of the overall wiring in the first gate metal layer, the second gate metal layer, and the source/drain metal layer in FIG. 5A.
Figure 5E:
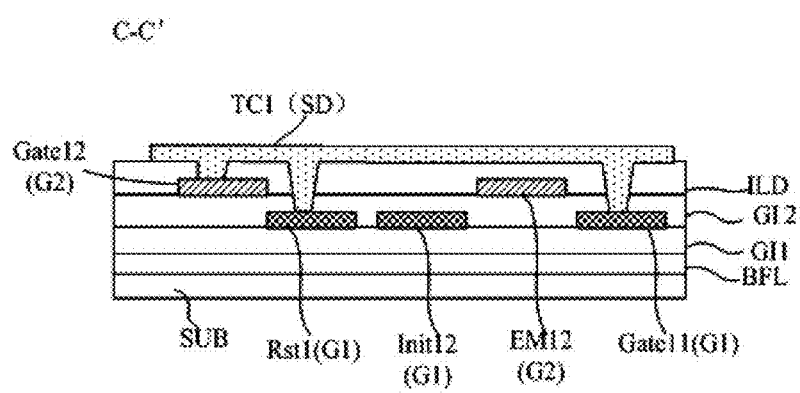
FIG. 5E is a cross-sectional view taken along the line CC' in FIG. 5D.
Figure 5F:
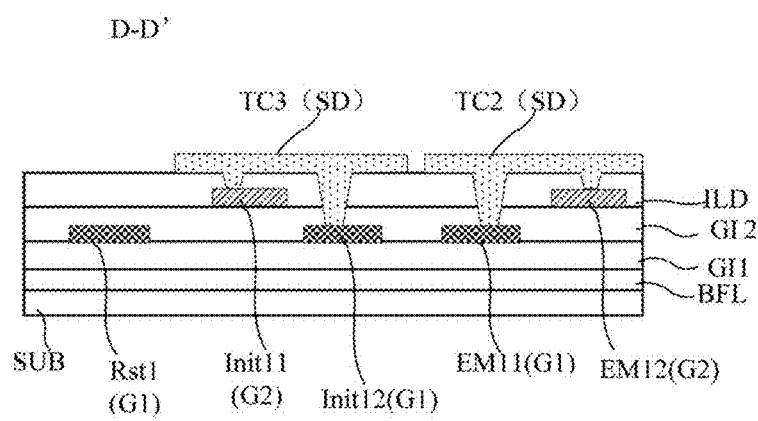
FIG. 5F is a cross-sectional view taken along the line DD' in FIG. 5D.

FIG. 4A is a schematic diagram of a specific structure of the area I in FIG. 1A. FIG. 4B is a schematic diagram of wiring in the first gate metal layer and the second gate metal layer in FIG. 4A. FIG. 4C is a schematic diagram of wiring in the source/drain metal layer in FIG. 4A. FIG. 4D is a cross-sectional view taken along the line AA' in FIG. 4A. FIG. 4E is a cross-sectional view taken along the line BB' in FIG. 4A. FIG. 5A is a schematic diagram of a specific structure of the area J in FIG. 1A. FIG. 5B is a schematic diagram of wiring in the first gate metal layer and the second gate metal layer in FIG. 5A. FIG. 5C is a schematic diagram of wiring in the source/drain metal layer in FIG. 5A. FIG. 5D is a schematic diagram of the overall wiring in the first gate metal layer, the second gate metal layer, and the source/drain metal layer in FIG. 5A. FIG. 5E is a cross-sectional view taken along the line CC' in FIG. 5D. FIG. 5F is a cross-sectional view taken along the line DD' in FIG. 5D.

As shown in FIGS. 4A to 5F, in some embodiments, the gate line main body part Gate11 of the first gate line Gate1, the control line main body part EM11 of each first light-emitting control line EM1, each second gate line Gate2, and each second light-emitting control line EM2 are disposed in the first gate metal layer G1; each second initialization line Init2, the initialization line main body part Init11 of each first initialization line Init1 are disposed in the second gate metal layer G2; and the data line main body part Data11 of the first data line Data1 is disposed in the source/drain metal layer SD. The second data line Data2 is disposed in the source/drain metal layer SD. The reset line Rst is disposed in the first gate metal layer G1.

Although the power supply line structure is not shown in FIG. 4A to 5F, it should be noted that, in some embodiments, the first power supply line VDD1 of the power supply line structure VDD is disposed in the second gate metal layer G2, the second power supply line VDD2 is disposed in the source/drain metal layer, and the first power supply line VDD1 is connected to the second power supply line VDD2 through a via penetrating through the interlayer dielectric ILD.

In some embodiments, as shown in FIG. 1A, the sensing area SA in the screen area SCA includes at least one first sensing area SA1 and/or at least one second sensing area SA2, and FIG. 1 shows a case where the screen area includes a plurality of sensing areas SA including at least one first sensing area SA1 and at least one second sensing area SA2, but it should be understood that the screen area SCA may include only one sensing area SA, which is the first sensing area SA1 or the second sensing area SA2. The light-transmitting area of the first sensing area SA1 is a circular area with a diameter d1, and the light-transmitting area of the second sensing area SA2 is a circular area with a diameter d2, wherein d1 is greater than d2. For example, d1 is between 3 mm and 4 mm, d2 is between 0.5 mm and 1.5 mm, for example, d2 is 1 mm. The first sensing area SA1 is configured to be arranged opposite to a camera, and the second sensing area SA2 is configured to be arranged opposite to a face recognition device.

Where the screen area includes the first sensing area SA1 and the second sensing area SA2, the first gate line Gate1 may overlap the first sensing area SA1, the second sensing area SA2, or both the first sensing area SA1 and the second sensing area SA2.

In some embodiments, where the screen area SCA includes a first sensing area SA1, a plurality of gate line connecting parts Gate12 and a plurality of data line connecting parts Data12 are disposed in the routing area RA1 of the first sensing area SA1. As shown in FIGS. 4A to 4C, each gate line connecting part Gate12 in the routing area RA1 of the first sensing area SA1 is disposed in the source/drain metal layer SD. The plurality of data line connecting parts Data12 in the routing area RA1 of the first sensing area SA1 are respectively disposed in the first gate metal layer G1 and the second gate metal layer G2, and the second gate metal layer G2 is located between the first gate metal layer G1 and the source/drain metal layer SD.

As shown in FIGS. 1A and 4A to 4C, in some embodiments, the reset line Rst connected to each row of the pixel structures P overlapping the sensing area SA in the row direction includes reset line main body parts Rst1 located on both sides of the sensing area SA, and each reset line main body part Rst1 is connected to the first gate line Gate1 or the second gate line connected to a previous row of pixel structures P. Specifically, the instant pixel structure P corresponds to a reset line main body part Rst1, where the gate line connected to pixel structures P in a previous row is a first gate line Gate1, the reset line main body part Rst1 is connected to the first gate line Gate1, and where the gate line connected to the pixel structures P in the previous row is a second gate line, the reset line main body part Rst1 is connected to the second gate line.

As shown in FIG. 4D, a gate line connecting part Gate12 disposed in the source/drain metal layer SD is connected to a corresponding gate line main body part Gate11 through a first via V1, which penetrates through the interlayer dielectric layer ILD and the second Gate insulating layer GI2. Where the first gate line Gate1 corresponding to the gate line connecting part Gate12 disposed in the source/drain metal layer SD is connected to a reset line Rst, specifically, the gate line connecting part Gate12 may be connected to the reset line Rst through a fifth via.

As shown in FIG. 4E, a data line connecting part Data12 disposed in the first gate metal layer G1 is connected to a corresponding data line main body part Data11 through a second via V2, which penetrates through the interlayer dielectric ILD and the second gate insulating layer GI2. A data line connecting part Data12 disposed in the second gate metal layer G2 is connected to a corresponding data line main body part Data11 through a third via V3, which penetrates through the interlayer dielectric layer ILD.

In some embodiments, as shown in FIGS. 1C and 4B, the display substrate further includes a connecting line CL surrounding the first sensing area SA, and each initialization line main body part Init11 is connected to the connecting line CL. The initialization line main body parts Init11 on both sides of the first sensing area SA are connected together to ensure that the display effects of the pixel structures P on both sides of the first sensing area SA are consistent, thereby preventing uneven brightness from occurring.

Alternatively, the connecting line CL may be disposed near and along an edge of the pixel structure P, the connecting line CL is a polyline and includes first extension parts CL1 extending in the row direction and second extension parts CL2 extending in the column direction, and the first extension parts CL1 and the second extension parts CL2 are alternately disposed and connected in sequence.

Alternatively, the connecting line CL and the initialization line main body part Init11 are both disposed in the second gate metal layer G2, and may be directly connected to each other. Alternatively, the connecting line CL may be disposed in the first electrode layer, and in this case, the connecting line CL is connected to the initialization line main body part Init11 through a fourth via penetrating through the interlayer dielectric layer ILD and the planarization layer PLN.

In some embodiments, where the screen area SCA includes a second sensing area SA2, a plurality of gate line connecting parts Gate12 and a plurality of data line connecting parts Data12 are disposed in the routing area RA2 of the second sensing area SA2. As shown in FIGS. 5A to 5F, the plurality of gate line connecting parts Gate12 in the routing area RA2 of the second sensing area SA2 are disposed in the first gate metal layer G1 and the second gate metal layer G2, respectively, and each data line connecting part Data12 of the routing area RA2 in the second sensing area SA2 is disposed in the source/drain metal layer SD.

In some embodiments, where the screen area SCA includes the second sensing area SA2, the first light-emitting control line EM1 connected to each row of the pixel structures P overlapping the second sensing area SA2 in the row direction includes, in addition to the control line main body part EM11 described above, a control line connecting part EM12 located in the routing area RA2 of the second sensing area SA2. The control line connecting parts EM12 are connected to the control line main body parts EM11 on both sides of the second sensing area SA2, wherein the plurality of control line connecting parts EM12 in the routing area RA2 of the second sensing area SA2 are respectively disposed in the first gate metal layer G1 and the second gate metal layer G2.

In some embodiments, where the screen area SCA includes the second sensing area SA2, the first initialization line Init1 connected to each row of the pixel structures P overlapping the second sensing area SA2 in the row direction further includes an initialization line connecting part Init12 located in the routing area RA2 of the second sensing area SA2, the initialization line connecting part Init12 is connected to the initialization line main body parts Init11 on both sides of the second sensing area SA2, wherein the initialization line connecting parts Init12 in the routing area RA2 of the second sensing area SA2 are respectively disposed in the first gate metal layer G1 and the second gate metal layer G2.

Alternatively, where the screen area SCA includes the second sensing area SA2, all of the control line connecting parts EM12, the initialization line connecting parts Init12, and the gate line connecting parts Gate12, to which the plurality of rows of pixel structures P overlapping the second sensing area SA2 in the row direction are connected, are alternately arranged in the first gate metal layer G1 and the second gate metal layer G2. For example, the pixel structures P of the $i^{th}$ to $j^{th}$ rows overlap the second sensing area SA2 in the row direction, and in this case, the control line connecting part EM12, to which the pixel structures P of the $i^{th}$ row are connected, is disposed in the second gate metal layer G2, the initialization line connecting part Init12, to which the pixel structures P of the $i^{th}$ row are connected, is disposed in the first gate metal layer G1, the gate line connecting part Gate12, to which the pixel structures P of the $i^{th}$ row are connected, is disposed in the second gate metal layer G2, the control line connecting part EM12, to which the pixel structures P of the $(i+1)^{th}$ row are connected, is disposed in the first gate metal layer G1, the initialization line connecting part Init12, to which the pixel structures P of the $(i+1)^{th}$ row are connected, is disposed in the second gate metal layer G2, the gate line connecting part Gate12, to which the pixel structures P of the $(i+1)^{th}$ row are connected, is disposed in the first gate metal layer G1, and so on.

As shown in FIG. 5E, a gate line connecting part Gate12 disposed in the second gate metal layer G2 is connected to a corresponding gate line main body part Gate11 through a first transitional connector TC1, which is disposed in the source/drain metal layer SD. Alternatively, where the gate line connecting part Gate12 disposed in the first gate metal layer G1 is connected to the corresponding gate line main body part Gate11, which may alternatively be achieved through the first transitional connector TC1 in the source/drain metal layer SD. Further, where a reset line main body part Rst1 is connected to a first gate lines Gate1 corresponding to the gate line connecting part Gate11 in the second sensing area SA2, which may alternatively be achieved through the first transitional connector TC1 describe above.

As shown in FIG. 5F, where a control line connecting part EM12 disposed in the second gate metal layer G2 is connected to a corresponding control line main body part EM11, they are connected to each other through a second transitional connector TC2 disposed in the source/drain metal layer SD. Where an initialization line connecting part Init12 disposed in the first gate metal layer G1 is connected to a corresponding initialization line main body part Init11, they are connected to each other through a third transitional connector TC3 disposed in the source/drain metal layer SD.

An embodiment of the present disclosure also provides a display apparatus, which includes the display substrate describe above. In addition, the display apparatus further includes a sensing device, such as a camera or a face recognition device, disposed on a backlight side of the display substrate. The sensing device is directly opposite to the light-transmitting area. A light-emitting side of the display substrate is a side of the display substrate along a light-emitting direction, and the backlight side of the display substrate is a side opposite to the light-emitting side.

It will be understood that the above embodiments are merely exemplary embodiments adopted to illustrate the principles of the present disclosure, and the present disclosure is not limited thereto. It will be apparent to one of ordinary skill in the art that various changes and modifications can be made without departing from the spirit and scope of the present disclosure, and these changes and modifications are to be considered within the scope of the present disclosure.

What is claimed is:

1. A display substrate, having a screen area, the screen area comprising at least one sensing area and a display area surrounding each of the at least one sensing area, the sensing area comprising a light-transmitting area and a routing area surrounding the light-transmitting area, wherein the display substrate comprises:
    a plurality of first gate lines, each of the plurality of first gate lines comprising a gate line main body part in the display area and a gate line connecting part connected to the gate line main body part, and at least a portion of the gate line connecting part being in the routing area and being bent along an edge trend of the light-transmitting area; and
    a plurality of first data lines insulated and spaced from each of the plurality of first gate lines, each of the plurality of first data lines comprising a data line main body part in the display area and a data line connecting part connected to the data line main body part, at least a portion of the data line connecting part being in the routing area and being bent along the edge trend of the light-transmitting area, and
    for any one of the routing areas, the plurality of data line connecting parts in the routing area are in at least two metal layers insulated and spaced from each other, and/or, the plurality of gate line connecting parts in the routing area are in at least two metal layers insulated and spaced from each other,
    wherein the display substrate further comprises pixel structures in a plurality of rows and in a plurality of columns, which are in the display area, each of the at least one sensing area overlaps at least two rows of the pixel structures in a row direction and overlaps at least two columns of the pixel structures in a column direction, and
    each row of pixel structures overlapped with the sensing area in the row direction are connected to one of the plurality of first gate line, and each column of pixel structures overlapped with the sensing area in the column direction are connected to at least one of the plurality of first data line,
    wherein the gate line main body part is in a first gate metal layer, and the data line main body part is in a source/drain metal layer,
    the at least one sensing area comprises at least one first sensing area and at least one second sensing area,
    a plurality of gate line connecting parts and a plurality of data line connecting parts are in the routing area of each of the at least one first sensing area, and each of the plurality of gate line connecting part in the routing area of the first sensing area is in a source/drain metal layer; the plurality of data line connecting parts in the routing area of the first sensing area are respectively in the first gate metal layer and a second gate metal layer which is between the first gate metal layer and the source/drain metal layer, and
    a plurality of gate line connecting parts and a plurality of data line connecting parts are in the routing area of each of the at least one second sensing area, the plurality of gate line connecting parts in the routing area of the second sensing area are respectively in the first gate metal layer and the second gate metal layer, and the plurality of data line connecting parts in the routing area of the second sensing area are all in the source/drain metal layer,
    wherein the display substrate further comprises a plurality of first light-emitting control lines and a plurality of first initialization lines, each row of the pixel structures overlapped with the sensing area in the row direction are connected to one of the plurality of first light-emitting control lines and one of the plurality of first initialization lines, and
    the first light-emitting control line comprises control line main body parts on both sides of the sensing area in the row direction, the control line main body parts are in the first gate metal layer; the first initialization line comprises initialization line main body parts in the display area, each of the initialization line main body parts is in the second gate metal layer,
    wherein the pixel structure comprises a light-emitting element, and
    the display substrate further comprises a connecting line surrounding and enclosing the first sensing area, each of the initialization line main body parts is connected to the connecting line, the connecting line is in the second gate metal layer or a first electrode layer, and the first electrode layer is a layer where a first electrode of the light-emitting element is located.

2. The display substrate according to claim 1, wherein the display substrate further comprises: a gate insulating layer between the first gate metal layer and the second gate metal layer, and an interlayer dielectric layer between the second gate metal layer and the source/drain metal layer,
    the gate line connecting part in the source/drain metal layer is connected to a corresponding gate line main body part through a first via, which penetrates through the interlayer dielectric layer and the gate insulating layer, the data line connecting part in the first gate metal layer is connected to a corresponding data line main body part through a second via, which penetrates through the interlayer dielectric layer and the gate insulating layer, the data line connecting part in the second gate metal layer is connected to a corresponding data line main body part through a third via, which penetrates through the interlayer dielectric layer, and the gate line connecting part in the first gate metal layer or the second gate metal layer is connected to a corresponding gate line main body part through a first transitional connector, which is in the source/drain metal layer.

3. The display substrate according to claim 1, wherein the connecting line is a polyline comprising first extension parts extending along the row direction and second extension parts extending along the column direction, and the first extension parts and the second extension parts are alternately arranged and connected in sequence.

4. The display substrate according to claim 1, wherein the display substrate further comprises: an interlayer dielectric layer between the second gate metal layer and the source/drain metal layer; and a planarization layer between the source/drain metal layer and the first electrode layer, and the connecting line is in the first electrode layer, the connecting line is connected to the initialization line main body part through a fourth via, which penetrates through the interlayer dielectric layer and the planarization layer.

5. The display substrate according to claim 1, wherein the display substrate further comprises a power supply line structure in a grid shape, each of the pixel structures is connected to the power supply line structure, the power supply line structure is outside the at least one sensing area, the power supply line structure comprises: a first power supply line extending in the row direction, which is in the second gate metal layer; and a second power supply line extending in the column direction, which is in the source/drain metal layer and connected to the first power supply line at an intersection with the first power supply line.

6. The display substrate according to claim 1, wherein the light-transmitting area of the first sensing area is a circular area with a diameter of d1, the light-transmitting area of the second sensing area is a circular area with a diameter of d2, and d1 is greater than d2.

7. The display substrate according to claim 6, wherein the diameter of d1 is between 3 mm and 4 mm, and the diameter of d2 is between 0.5 mm and 1.5 mm.

8. The display substrate according to claim 1, wherein the first light-emitting control line connected to each row of the pixel structures overlapping the second sensing area in the row direction further comprises a control line connecting part in the routing area of the second sensing area, the control line connecting part is connected to control line main body parts on both sides of the second sensing area, the plurality of control line connecting parts in the routing area of the second sensing area are respectively in the first gate metal layer and the second gate metal layer, and the first initialization line connected to each row of the pixel structures overlapping the second sensing area in the row direction further comprises an initialization line connecting part in the routing area of the second sensing area, the initialization line connecting part is connected to initialization line main body parts on both sides of the second sensing area, the plurality of initialization line connecting parts in the routing area of the second sensing area are respectively in the first gate metal layer and the second gate metal layer.

9. The display substrate according to claim 8, wherein the control line connecting part in the second gate metal layer is connected to a corresponding control line main body part through a second transitional connector, which is in the source/drain metal layer.

10. The display substrate according to claim 8, wherein the initialization line connecting part in the first gate metal layer is connected to a corresponding initialization line main body part through a third transitional connector, which is in the source/drain metal layer.

11. The display substrate according to claim 1, wherein the display substrate further comprises a plurality of second gate lines, a plurality of second data lines, a plurality of second initialization lines, and a plurality of second light-emitting control lines, each of the plurality of second gate lines, each of the plurality of second initialization lines, and each of the plurality of second light-emitting control lines extend in the row direction, each of the plurality of second gate lines, each of the plurality of second initialization lines, and each of the plurality of second light-emitting control lines do not overlap the at least one sensing area in the row direction, each of the plurality of second data lines extends in the column direction, and each of the plurality of second data lines does not overlap the at least one sensing area in the column direction, and the second gate line and the second light-emitting control line are in a first gate metal layer, the second initialization line is in a second gate metal layer, and the second data line is in a source/drain metal layer.

12. The display substrate according to claim 11, wherein the display substrate further comprises a plurality of reset lines connected in a one-to-one correspondence to the plurality of rows of the pixel structures, the reset line connected to each row of the pixel structures overlapping the sensing area in the row direction comprises reset line main body parts on both sides of the sensing area, each of the reset line main body parts is connected to the first gate line or the second gate line connected to a previous row of the pixel structures, and the reset line is in the first gate metal layer.

13. A display apparatus, comprising: the display substrate according to claim 1; and a sensing device on a backlight side of the display substrate, wherein the sensing device is directly opposite to the light-transmitting area.

14. The display apparatus according to claim 13, wherein the sensing device is a camera or a face recognition device.

* * * * *